(12) United States Patent
Bringivijayaraghavan

(10) Patent No.: US 9,001,594 B2
(45) Date of Patent: Apr. 7, 2015

(54) APPARATUSES AND METHODS FOR ADJUSTING A PATH DELAY OF A COMMAND PATH

(75) Inventor: Venkat Bringivijayaraghavan, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 13/543,698

(22) Filed: Jul. 6, 2012

(65) Prior Publication Data

US 2014/0010025 A1   Jan. 9, 2014

(51) Int. Cl.
*G11C 16/04* (2006.01)
*G11C 7/10* (2006.01)
*G11C 7/22* (2006.01)

(52) U.S. Cl.
CPC .............. *G11C 7/109* (2013.01); *G11C 7/1093* (2013.01); *G11C 7/222* (2013.01); *G11C 2207/2254* (2013.01)

(58) Field of Classification Search
USPC ............ 365/189.05, 194, 233.1, 193, 233.16; 327/158, 149, 146–147
See application file for complete search history.

(56) References Cited

U.S. PATENT DOCUMENTS

| | | | |
|---|---|---|---|
| 5,004,933 A | 4/1991 | Widener | |
| 6,111,810 A * | 8/2000 | Fujita | 365/230.06 |
| 6,219,384 B1 | 4/2001 | Kliza et al. | |
| 6,275,077 B1 | 8/2001 | Tobin et al. | |
| 6,424,592 B1 | 7/2002 | Maruyama | |
| 6,459,313 B1 | 10/2002 | Godbee et al. | |
| 6,489,823 B2 | 12/2002 | Iwamoto | |
| 6,510,095 B1 | 1/2003 | Matsuzaki et al. | |
| 6,636,110 B1 | 10/2003 | Ooishi et al. | |
| 6,710,726 B2 | 3/2004 | Kim et al. | |
| 6,781,861 B2 | 8/2004 | Gomm et al. | |
| 6,839,288 B1 | 1/2005 | Kim et al. | |
| 6,861,901 B2 | 3/2005 | Prexl et al. | |
| 6,914,798 B2 | 7/2005 | Kwon et al. | |
| 6,930,955 B2 | 8/2005 | Johnson et al. | |
| 6,988,218 B2 | 1/2006 | Drexler | |
| 7,042,799 B2 | 5/2006 | Cho | |
| 7,046,060 B1 | 5/2006 | Minzoni et al. | |
| 7,061,941 B1 | 6/2006 | Zheng | |
| 7,065,001 B2 | 6/2006 | Johnson et al. | |

(Continued)

OTHER PUBLICATIONS

Related U.S. Appl. No. 13/531,341, filed Jun. 22, 2012.

(Continued)

*Primary Examiner* — David Lam
(74) *Attorney, Agent, or Firm* — Dorsey & Whitney LLP

(57) ABSTRACT

Apparatuses and method for adjusting a path delay of a command path are disclosed. In an example apparatus, a command path configured to provide a command from an input to an output includes an adjustable delay. The adjustable delay is configured to add delay to the command path delay, wherein the delay of the adjustable delay is based at least in part on a phase relationship between a feedback signal responsive to the command propagating through the command path and a clock signal. An example method includes configuring a command path to add delay to a command path delay to provide an internal write command signal to perform a write operation on write data corresponding to the internal write command, and propagating the write data corresponding to the internal write command through a data path without further delaying the write data to match the command path delay.

23 Claims, 5 Drawing Sheets

(56) References Cited

U.S. PATENT DOCUMENTS

| | | |
|---|---|---|
| 7,119,591 B1 | 10/2006 | Lin |
| 7,209,396 B2 | 4/2007 | Schnell |
| 7,248,512 B2 | 7/2007 | Shin |
| 7,268,605 B2 | 9/2007 | Fang et al. |
| 7,336,752 B2 | 2/2008 | Vlasenko et al. |
| 7,463,534 B2 | 12/2008 | Ku et al. |
| 7,489,172 B2 | 2/2009 | Kim |
| 7,509,517 B2 | 3/2009 | Matsumoto et al. |
| 7,593,273 B2 | 9/2009 | Chu et al. |
| 7,609,584 B2 | 10/2009 | Kim et al. |
| 7,616,040 B2 | 11/2009 | Motomura |
| 7,671,648 B2 | 3/2010 | Kwak |
| 7,698,589 B2 | 4/2010 | Huang |
| 7,822,904 B2 | 10/2010 | LaBerge |
| 7,826,583 B2 | 11/2010 | Jeong et al. |
| 7,885,365 B2 | 2/2011 | Hagleitner et al. |
| 7,983,094 B1 | 7/2011 | Roge et al. |
| 8,018,791 B2 | 9/2011 | Kwak |
| 8,144,529 B2 * | 3/2012 | Chuang et al. ............... 365/194 |
| 8,321,714 B2 | 11/2012 | Wu et al. |
| 8,358,546 B2 | 1/2013 | Kim et al. |
| 8,392,741 B2 * | 3/2013 | Kim et al. .................... 713/401 |
| 8,509,011 B2 | 8/2013 | Bringivijayaraghavan |
| 8,644,096 B2 | 2/2014 | Bringivijayaraghavan |
| 8,788,896 B2 | 7/2014 | Tekumalla |
| 2002/0057624 A1 | 5/2002 | Manning |
| 2005/0024107 A1 | 2/2005 | Takai et al. |
| 2005/0047222 A1 | 3/2005 | Rentschler |
| 2005/0132043 A1 | 6/2005 | Wang et al. |
| 2005/0270852 A1 | 12/2005 | Dietrich et al. |
| 2006/0062341 A1 | 3/2006 | Edmondson et al. |
| 2006/0182212 A1 | 8/2006 | Hwang et al. |
| 2006/0193194 A1 | 8/2006 | Schnell |
| 2007/0046346 A1 | 3/2007 | Minzoni |
| 2007/0192651 A1 | 8/2007 | Schoch |
| 2007/0291558 A1 | 12/2007 | Joo |
| 2008/0080267 A1 | 4/2008 | Lee |
| 2008/0144423 A1 | 6/2008 | Kwak |
| 2009/0232250 A1 | 9/2009 | Yamada et al. |
| 2010/0066422 A1 | 3/2010 | Tsai |
| 2010/0199117 A1 | 8/2010 | Kwak |
| 2010/0232213 A1 | 9/2010 | Hwang et al. |
| 2011/0047319 A1 | 2/2011 | Jeon et al. |
| 2011/0298512 A1 | 12/2011 | Kwak |
| 2012/0084575 A1 | 4/2012 | Flores et al. |
| 2013/0141994 A1 | 6/2013 | Ito et al. |
| 2013/0194013 A1 | 8/2013 | Kwak |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0177359 A1 | 6/2014 | Kumar et al. |
| 2014/0258764 A1 | 9/2014 | Kwak |

OTHER PUBLICATIONS

Related U.S. Appl. No. 13/592,244, filed Aug. 22, 2012.

* cited by examiner

APPARATUSES AND METHODS FOR ADJUSTING A PATH DELAY OF A COMMAND PATH

TECHNICAL FIELD

Embodiments of the invention relate generally to semiconductor memory, and more specifically, in one or more described embodiment, to timing internal clock, data, and command signals for executing memory commands in a memory.

BACKGROUND

In semiconductor memory, proper operation of the memory is based on the correct timing of various internal command, data, and clock signals. For example, in writing data to memory internal clock signals that clock data path circuitry to latch write data may need to be provided with specific timing relationships with internal write command signals to properly enable the data path circuitry to provide the latched write data for writing to memory. If the timing of the internal write command signal is not such that the data path circuitry is enabled at the time the internal clock signal clocks the data path circuitry to provide the write data at an expected time, the write command may be inadvertently ignored or the write data provided to the memory may not be correct (e.g., the write data is associated with another read command).

Moreover, as known, various latencies (e.g., command address latency, parity latency, additive latency, write latency) may be programmed to set a time, typically in number of clock periods tCK, between receipt of a write command by the memory and when the write data is provided to the memory. The latency may be programmed by a user of the memory to accommodate clock signals of different frequencies (i.e., different clock periods). Internal clock, data, and write command paths should be designed to provide propagation delays for the respective signals to account for the latency, for example, the latencies between receipt of a write command and receipt of the write data for the write command. Other examples of commands that may require the correct timing of internal clock, data, and command signals for proper operation include, for example, read commands and on-die termination enable commands.

Complicating the generation of correctly timed internal clock, data, and command signals is the relatively high-frequency of memory clock signals. For example, memory clock signals can exceed 1 GHz. Further complicating the matter is that multi-data rate memories may receive data at a rate higher than the memory clock signal. An example of a multi-data rate memory is one that receives write data at a rate twice that of the clock frequency, such as receiving write data synchronized with rising and falling clock edges of the memory clock signal. The frequency of the memory clock signal may be the frequency at which write commands are executed. As a result, the timing domains of command and clock signals may need to be crossed in order to maintain proper timing of the internal clock, data, and command signals.

An example conventional approach to maintaining the timing of internal write command, data, and clock signals is modeling both the data path and the write command path to have the same propagation delay. For example, a data path, which typically has a shorter inherent path delay than the write path, may include delay circuits to provide a total path delay that matches that of the write path. This may require, however, that delays and/or counter circuitry run continuously during memory operation. Moreover, delay circuits in the data path are replicated for every bit of the data path, thus a wider data path results in a corresponding increase in delay circuits. As a result, power consumption may be higher than desirable. Additionally, the propagation delay of the various internal clock, data, and command paths can often vary due to changes in power, voltage, and temperature conditions. For clock, data and command paths having relatively long propagation delay or additional delay circuitry, the variations due to changing operating conditions may negatively affect the timing of the internal signals to such a degree that the memory does not operate properly.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
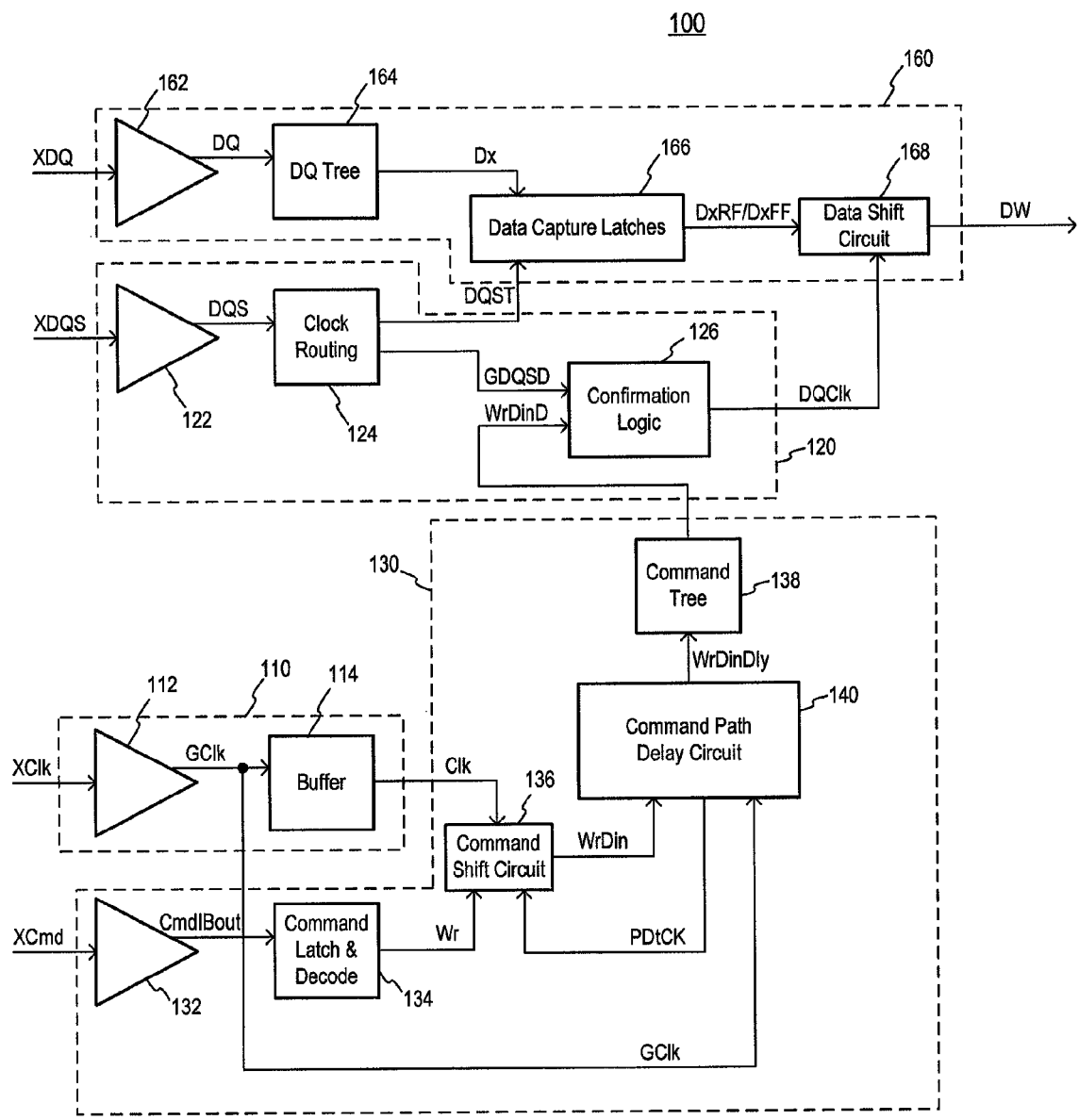
FIG. 1 is a block diagram of an apparatus including a command path according to an embodiment of the invention.

FIG. 1 illustrates an apparatus 100 including a command path 130 according to an embodiment of the invention. FIG. 1 further illustrates clock paths 110 and 120, and data path 160. The clock path 110 and clock path 120 are configured to provide clock signals that may be used to clock circuits during operation of the command path 130 and the data path 160. Although FIG. 1 will be specifically described with reference to write commands and write data, other embodiments may include other examples of commands and data. The term "provide" (and forms thereof) shall be broadly construed to include, for example, generate, output, apply, etc., and is intended to generally cover other such acts.

The clock path 110 includes a clock receiver 112 configured to receive a clock signal XClk and provide an output clock signal GClk to a clock buffer 114. The clock receiver 112 may drive the signal levels of the XClk signal to full clock signal voltages before providing the resulting GClk signal to the clock buffer 114. The clock buffer 114 may be configured to buffer the GClk signal and provide a Clk signal to the command path 130. The GClk signal is also provided to the command path 130. The buffer 114 may also further delay the GClk signal before being output as the Clk signal for the purpose of matching propagation delay of circuitry in the command path 130. As known, electronic circuitry have inherent propagation delays which may result in signal delays as a signal is received and provided by the circuitry. For example, as the XClk signal propagates through the clock receiver 112 and clock buffer 114, GClk and Clk signals may have respective phases that are different than that of the XClk signal.

The clock path 120 includes a clock receiver 122 configured to receive the write clock signal XDQS and provide an output clock signal DQS to clock routing 124. The clock receiver 122 may drive the signal levels of the XDQS signal to full clock signal voltages before providing the resulting DQS signal to clock routing 124. Clock routing 124 may represent clock signal routing that is used to provide the DQS signal throughout a memory to be used by other circuitry. For example, DQS signal may be routed by clock routing 124 to be provided as DQ strobe signal DQST to circuitry of the data path 160 for use in capturing write data, as will be described in more detail below. The clock routing 124 also provides the DQS signal as a GDQSD signal to confirmation logic 126. The confirmation logic 126 generates a DQ clock signal DQClk responsive to the GDQSD signal and a write data command signal WrDinD, which is provided by the command path 130. The confirmation logic confirms that an internal write command (represented by the WrDinD signal) is active for a portion of the DQS signal and provides the DQClk signal to clock output write data from the data path 160, as will be described in more detail below.

The data path 160 includes a data receiver 162 configured to receive write data XDQ and provide write data DQ to data tree 164. The data tree 164 is configured to provide (e.g., distribute) the DQ write data as Dx write data to data capture latches 166. The data capture latches 166 latch the Dx write data responsive to clock edges of the DQST signal from the clock path 120, and provide the latched data as DxRF and DxFF write data to a data shift circuit 168. The DxRF write data is provided responsive to a rising edge of the DQST signal and the DxFF write data is provided responsive to a falling edge of the DQST signal. For example, the data capture latches 166 latch the Dx write data and provide it as DxRF write data responsive to clock edges of the DQST signal (e.g., rising clock edges) to the data shift circuit 168. The data capture latches 166 latch the Dx write data and provide it as DxFF write data responsive to clock edges of the DQST signal (e.g., falling clock edges) to the data shift circuit 168. The data shift circuit 168 provides the DxRF, DxFF write data as DW write data responsive to the DQClk signal from the clock path 120. In general, the operation by the data capture latches 166 and the data shift circuit 168 responsive to the DQST and DQClk provide a serial-to-parallel write data operation. For example, the write data Dx may be latched (e.g., in parallel) at twice the frequency of the XDQS signal and provided as serial write data DW at a lower frequency of the XDQS signal, which has the same clock frequency as the XClk signal.

In some embodiments, the XDQ write data is provided to the data receiver 162 center-aligned with clock edges of the XDQS signal. The propagation delay through the data receiver 162 and the data tree 164 is approximately the same as the propagation delay through the clock receiver 122 and the clock routing 124 of clock path 120. As a result, the Dx write data provided by the data tree 164 remains substantially center-aligned with edges of the DQST signal provided by the clock routing 124.

The command path 130 may be configured to receive a write command XCmd and provide an internal write command, represented in FIG. 1 as the WrDin signal, to various circuitry for use during a write operation. The command path 130 has a command path delay. That is, the command path 130 takes a finite time, as known, to propagate a command signal to circuitry using the command. The command signal provided to the circuitry may be used, for example, to enable its operation.

The command path 130 of FIG. 1 includes a command receiver 132 that is configured to receive the XCmd and provide an output command signal CmdIBOut to a command latch and decoder 134. The command latch and decoder 134 latches, decodes, and provides the CmdIBOut signal as a Wr signal to the write command shift circuit 136. The Wr and Clk signals may have the same phase relationship as the XCmd and XClk signals due to similar propagation delays through receivers 112, 132, and the buffer 114 and command latch and decoder 134.

The write command shift circuit 136 shifts the Wr signal through to be output as a delayed write command signal WrDin responsive to the Clk signal from the clock path 110. The shifting through the write command shift circuit 136 adds clock cycles tCK of the Clk signal, for example, to provide additional latency to the propagation of the command signal through the command path 130. The additional latency (e.g., number of tCKs) may be based, for example, on one or several operational parameters for the circuit. In some embodiments, operational parameters may include command-address latency, parity latency, additive latency, and CAS write latency. The operational parameters may also include a minimum command path delay, that is, the inherent propagation delay through the command path 130 without any delay added, for example, for accommodating latency. An example delay provided by the write command shift circuit 136 may be the sum of the latencies less the minimum command path delay. The minimum command path delay, as with other operations parameters, may be defined in numbers of clock cycles.

The WrDin signal is provided to a command path delay circuit 140 for additional delay before being provided as the WrDinDly signal to a command tree 138. The command tree 138 is configured to provide (e.g., distribute) the WrDinDly signal as the internal write command signal WrDinD to the confirmation logic 126.

As will be described in more detail below, the command path delay circuit 140 adds delay to the command path 130 to provide the WrDinDly signal to the confirmation logic 126 so that the DQClk signal clocks the data shift circuit 168 at the time write data corresponding to the write command is to be output by the data shift circuit 168. In contrast to conventional approaches previously described, which uses a data path 160 that includes circuits that add delay to provide a total data path delay that matches that of the command path 130, the command path 130 includes additional delays for a total command path delay that provides the WrDinD signal at the proper timing for use with the clock path 120 and/or data path 160.

Figure 2:
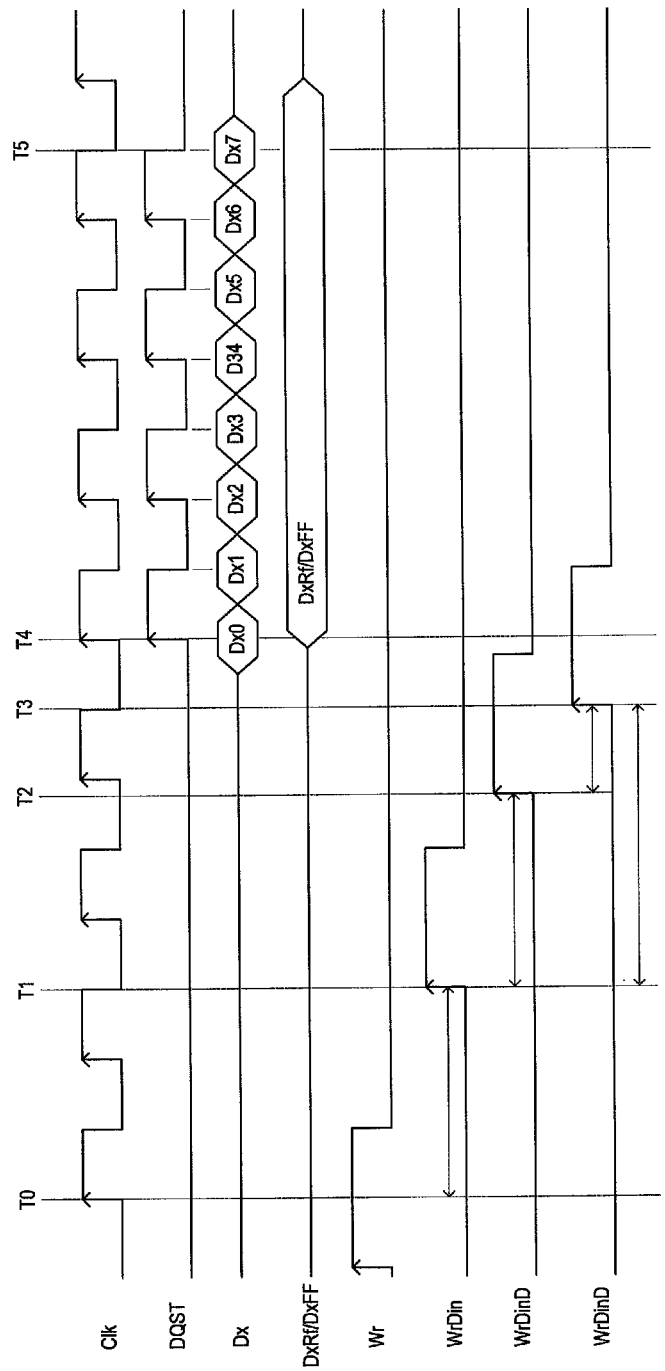
FIG. 2 is a timing diagram of various signals during operation of command and data paths according to an embodiment of the invention.

FIG. 2 is a timing diagram illustrating various signals during operation of the apparatus 100 according to an embodiment of the invention. The Clk signal is provided by the clock buffer 114, the DQST signal is provided by the clock routing 124, and the Dx signal is provided by the DQ tree 164, as previously discussed. For the example of FIG. 2, it is, assumed that the latency is a total of four tCK and the data burst length is eight.

At time T0 the rising edge of the Clk signal clocks the command shift circuit 136 to latch a Wr signal, which represents a write command and begin shifting the Wr signal. The Wr signal is shifted through the command shift circuit 136 responsive to the Clk signal and provided as the WrDin signal at time T1. A rising edge of the WrDinD signal at time T2 represents the WrDin signal after propagating through the command path 130 to the confirmation logic 126 without additional delay added, for example, by the command path delay circuit 140. As illustrated in FIG. 2, without any additional delay in the command path 130 the WrDinD signal is provided to the confirmation logic 126 too early for the write data Dx, which is provided to the data capture latches 166 at time T4. Time T4 corresponds to four tCK after the Wr command due to the latency of four tCKs.

FIG. 2 further illustrates a rising edge of the WrDinD signal at time T3, which represents the case where additional delay is provided by command path delay circuit 140 to increase the total command path delay. The resulting WrDinD signal is active (e.g., high logic level) as the Dx data is provided to the data capture latches 166 and latched by the DQST signal. Thus, the WrDinD signal having the rising edge at time T3 is timed correctly so that the write data corresponding to the write command can be written. The Dx0-Dx7 data (recall a burst length of eight) is latched and provided by the data capture latches 166 as the DxRF, DxFF data responsive to the rising and falling edges of the DQST signal between times T4 and T5.

As illustrated in FIG. 2, by adding delay to the command path 130, such as with the command path delay circuit 140, the WrDinD signal having the rising edge at time T3 is provided to the confirmation logic 126 with the necessary timing to carry out the write operation with the corresponding write data, without having to add delay to the data path 160 to correctly time the data and command. The WrDinD signal at time T3 also provides sufficient timing margin relative to the Dx data to accommodate timing variations that may occur due to process, voltage, and/or temperature, thus providing greater operational robustness.

Figure 3:
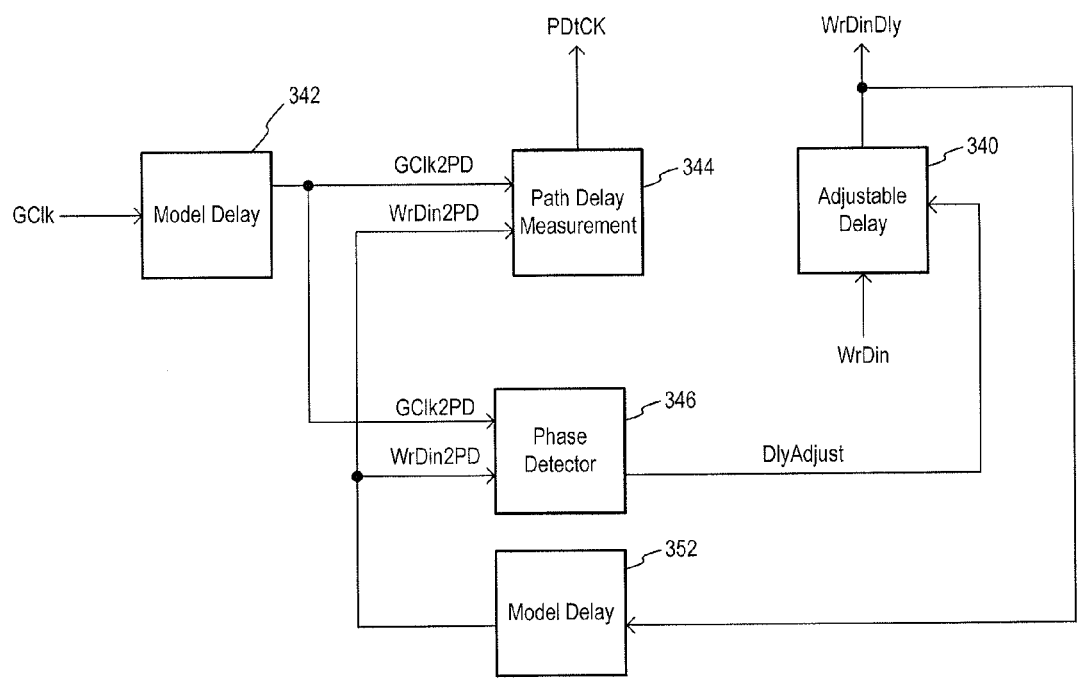
FIG. 3 is a block diagram of a command path delay circuit according to an embodiment of the invention.

FIG. 3 illustrates a command path delay circuit 300 according to an embodiment of the invention. The command path delay circuit 300 may be used for the command path delay circuit 140 (FIG. 1).

The command path delay circuit 300 includes model delay 342 coupled to receive the GClk signal and model the propagation delay of the data tree 164 of the data path 160 (FIG. 1). The delayed GClk signal is provided as a GClk2PD signal to a path delay measurement circuit 344 and phase detector 346. The path delay measurement circuit 344 provides a count signal PDtCK to the write command shift circuit 136 that represents the minimum command path delay in number of clock cycles tCK. As previously discussed, the write command shift circuit 136 may use the minimum command path delay to determine how many clock cycles to shift a command before providing it as the WrDin signal. The phase detector 346 compares the GClk2PD signal and a feedback signal WrDin2PD and provides a delay adjustment signal DlyAdjust to an adjustable delay 340 based on the relative phases of the GClk2PD and WrDin2PD signals.

Although the path delay measurement circuit 344 is illustrated in FIG. 3 as a separate block included in the command path delay circuit 300, in some embodiments the path delay measurement circuit 344 is included with other circuitry not included in the command path delay circuit 300. For example, in some embodiments a path delay measurement circuit is included in a circuit for counting a forward path delay of another signal path. Therefore, the present invention is not limited to the specific embodiment illustrated and described with reference to FIG. 3.

The adjustable delay 340 has a delay that is based at least in part on the DlyAdjust signal from the phase detector 346. As will be described in more detail below, the adjustable delay 340 adds delay to the command path 130 so that the WrDinDly signal is provided with the appropriate timing to the clock path 120 and/or data path 160 for the write operation. The WrDinDly signal is also provided to a model delay 352. The delay of the adjustable delay 340 is not limited to increments of tCK, as with the command shift circuit 136. That is, the adjustable delay 340 may include delay units that may be enabled to add incremental delay, depending on the DlyAdjust signal, as in other adjustable delays, for example, included in a clock circuit such as a delay-lock loop. As previously discussed with reference to FIG. 1, the WrDinDly signal is based on the command signal propagating through the command path 130. The WrDinDly signal is provided by the model delay 352 as the feedback signal WrDin2PD to the path delay measurement circuit 344 and the phase detector 346. The delay of the model delay 352 models the propagation delay of the command tree 138.

In some embodiments, the WrDinD signal provided by the command tree 138 is provided to the path delay measurement circuit 344 and the phase detector 346 as the WrDin2PD signal. That is, the WrDinD signal is already delayed by the command tree 138, thus eliminating the need to further model the propagation delay of the command tree 138. The model delay 352 may be omitted in these embodiments. Other embodiments may incorporate additional delay modeling the propagation delay of the command tree 138, for example, additional delay may be included in the path delay measurement circuit 344 and/or the phase detector 346. In some embodiments, the propagation delay of the command tree 138 may be ignored and no additional delay added to the WrDinDly signal before providing it as the WrDin2PD signal to the path delay measurement circuit 344 and the phase detector 346.

The path delay measurement circuit uses the GClk2PD and WrDin2PD signals to provide the PDtCK signal to the command shift circuit 136. As previously discussed, the PDtCK signal represents the minimum command path delay in terms of tCKs, which may be used by the command shift circuit 136 to determine how much to shift a Wr signal before providing it as the WrDin signal. The delay difference between the GClk2PD signal and the WrDin2PD signal generally represents the minimum path delay when the command shift circuit 136 is set to a minimum number of shifts and the adjustable delay 340 is set to a minimum delay. Such a condition may exist at initialization or reset, at which time, the path measurement circuit 344 may be enabled to measure the minimum command path delay and provide PDtCK. In some embodiments, the path measurement circuit 344 may be disabled upon completion of the counting operation.

The adjustable delay 340 is adjusted to provide additional delay that will result in the WrDinD signal being provided to the confirmation logic 126 at the appropriate time to carry out the write operation with the associated write data. In the embodiment illustrated in FIG. 3, the amount of additional delay is determined based at least in part on the phase difference between the GClk2PD signal and WrDin2PD signal. Typically the phase difference will be determined with the command shift circuit 136 set to provide the number of shifts under normal operation. The phase detector 346 will provide the DlyAdjust signal to adjust the delay of the adjustable delay circuit 340 so that the GClk2PD and WrDin2PD signals are in-phase. When the two signals are in-phase, the WrDinD signal provided by the command tree 138 will also be in phase with the GClk2PD and WrDin2PD signals. The resulting WrDinD signal has the appropriate timing to cause the confirmation logic 126 to provide the DQClk signal to carry out a write operation on the write data XDQ that corresponds to the XCmd. In some embodiments, the phase detector 346 may be disabled after the adjustable delay circuit 340 is adjusted to synchronize the GClk2PD and WrDin2PD signals. The phase detector 346 may be enabled periodically to re-synchronize the GClk2PD and WrDin2PD signals, if necessary. The phase detector may be enabled responsive to an event, for example following initialization or reset.

Figure 4:
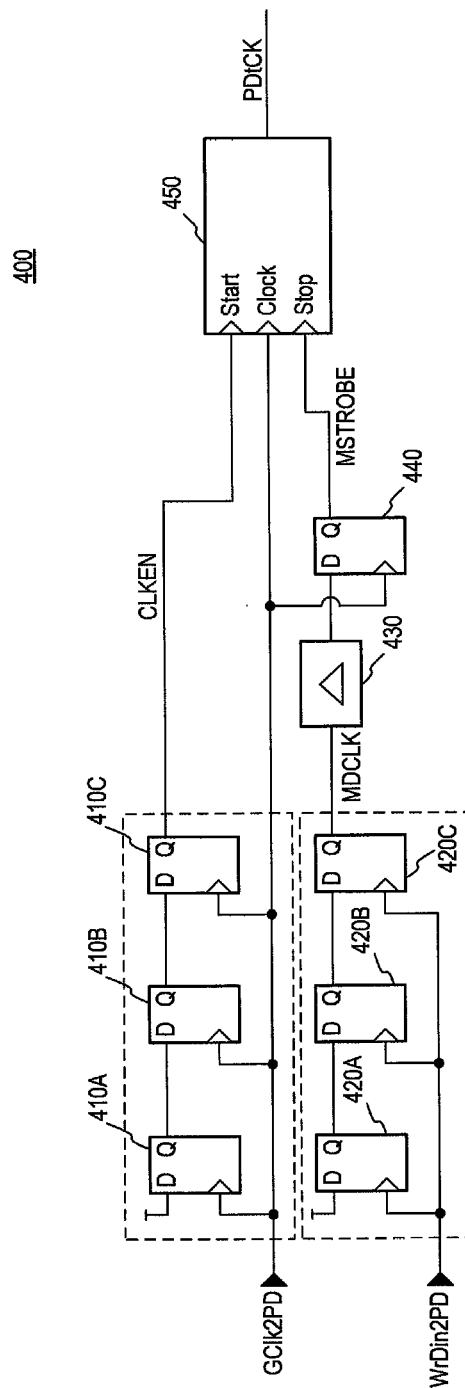
FIG. 4 is a block diagram of a path delay measurement circuit that may be used in an embodiment of the invention.

FIG. 4 illustrates a path delay measurement circuit 400 according to an embodiment of the invention. The path delay measurement circuit 400 is configured to measure a path delay in terms of a number of clock cycles of a clock signal. The path delay measurement circuit 400 may be used for the path delay measurement circuit 344 (FIG. 3).

The path delay measurement circuit 400 includes a first series of data flip flops 410A-C configured to receive a first clock signal (e.g., the GClk2PD signal of FIG. 1) and provide a clock enable signal CLKEN. The CLKEN signal is provided to a counter 450 as a start input. The GClk2PD signal further clocks the counter 450. The path delay measurement circuit 400 further includes a second series of data flip flops 420A-C configured to receive a second clock signal (e.g., the WrDin2PD signal of FIG. 1) and provide a measurement delay clock signal MDCLK. The MDCLK signal is provided to a delay element 430. The delay element 430 provides a fixed minimum delay may be included to allow a clock circuit to which the forward path measurement circuit 400 is coupled to operate over a wide range of conditions. The amount of delay provided by the delay element 430 may vary depending on the particular implementation. The delay element 430 is coupled to a data flip flop 440 that is clocked by the GClk2PD signal to generate a measurement pulse signal MSTROBE. The MSTROBE signal is provided to the counter 450 as a stop input.

In operation, when the GClk2PD signal begins to transition responsive to the XClk, the first series of data flip flops 410A-C are clocked. At a later point in time, the XCmd signal propagates, for example, through the command path 130, to be provided as the WrDinDly signal and fed back on a feedback path through the model delay 152, rising edges are seen in the WrDin2PD signal, which clocks the second series of data flip flops 420A-C. Following the third clock pulse (due to there being three flip flops in the first series of data flip flops 410A-C), the CLKEN signal is asserted, and the counter 450 begins counting each pulse of the GClk2PD signal. The WrDin2PD signal clocks second series of data flip flops 420A-C, and after the third pulse, the MDCLK signal is asserted. The MDCLK signal passes through the delay element 430 and is latched in the data flip flop 440 following the next rising edge of the GClk2PD signal, thus generating the MSTROBE signal. The MSTRBE signal stops the counter 450. The start and stop signals provided to the counter 450 are synchronized with the rising edge of the GClk2PD signal. The value of the counter 450, PDtCK, represents the number of clock cycles required for a command to propagate through the command path 130. In some embodiments, the PDtCK count is maintained in the counter 450 and stored and referenced when needed.

In the embodiment illustrated in FIG. 4, three data flip flops are included in the first and second series of data flip flops 410A-C, 420A-C to allow the command path to be populated with clock signals and stabilize. In other embodiments, however, the number of flip flops in the series of data flip flops 410A-C, 420A-C may vary depending on the particular implementation.

Figure 5:
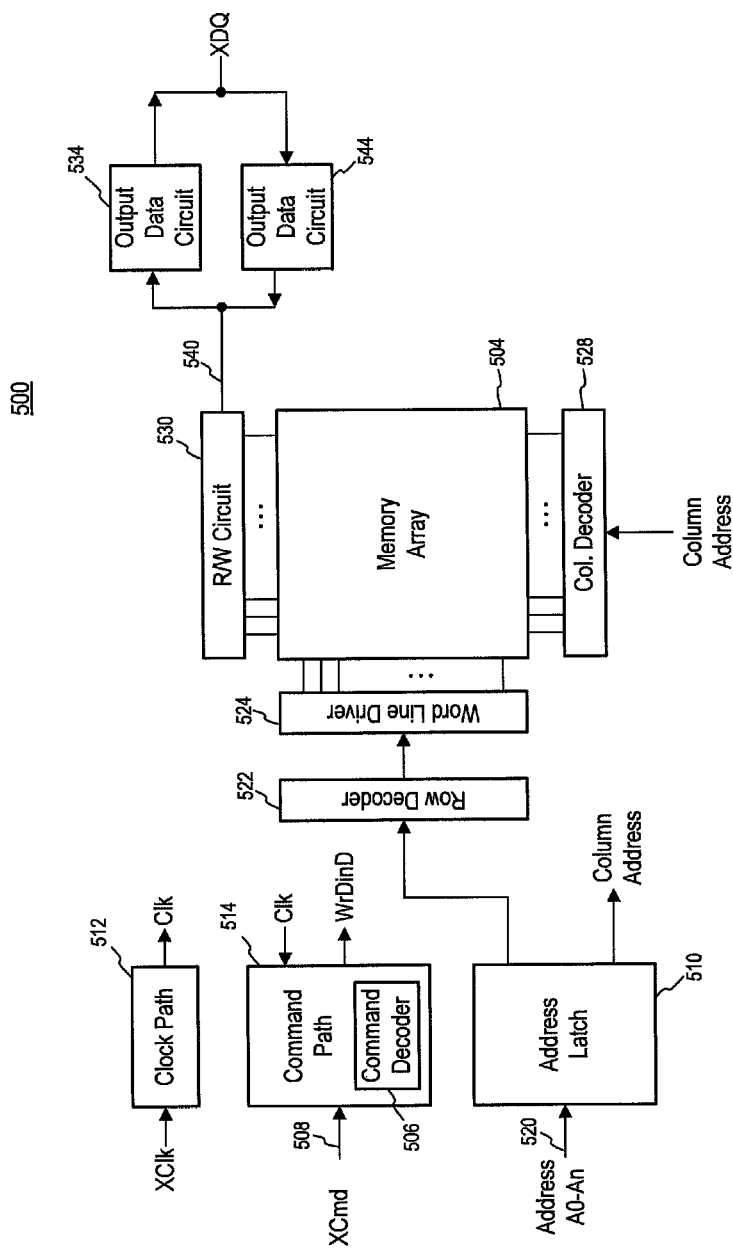
FIG. 5 is a block diagram of a memory including a command path according to an embodiment of the invention.

FIG. 5 illustrates a portion of a memory 500 according to an embodiment of the present invention. The memory 500 includes an array 504 of memory cells, which may be, for example, DRAM memory cells, SRAM memory cells, flash memory cells, or some other types of memory cells. The memory 500 includes a command path 514 that receives memory commands XCmd on a command bus 508 and provides internal memory signals, for example, a WrDinD signal. The command path 514 may be implemented using a command path according to an embodiment of the invention. A decoder 506 decodes the XCmd and generates corresponding control signals within the memory 500 to carry out various memory operations. The command decoder 506 responds to memory commands applied to the command bus 508 to perform various operations on the memory array 504. For example, the command decoder 506 is used to generate internal control signals to read data from and write data to the memory array 504. The memory 500 further includes a clock path 512. The clock path 512 receives a clock signal XClk and propagates an internal clock signal Clk, which is based at least in part on the XClk signal, to the command path 514.

Row and column address signals are applied to the memory 500 through an address bus 520 and provided to an address latch 510. The address latch then provides a separate column address and a separate row address. The row and column addresses are provided by the address latch 510 to a row address decoder 522 and a column address decoder 528, respectively. The column address decoder 528 selects bit lines extending through the array 504 corresponding to respective column addresses. The row address decoder 522 is connected to word line driver 524 that activates respective rows of memory cells in the array 504 corresponding to received row addresses. The selected data line (e.g., a bit line or bit lines) corresponding to a received column address are coupled to a read/write circuitry 530 to provide read data to an output data circuit 534 via an input-output data bus 540. Write data are applied to the memory array 504 through the input data circuit 536 and the memory array read/write circuitry 530.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:
1. An apparatus, comprising:
a command path having a command path delay and configured to provide a command from an input to an output, the command path including an adjustable delay having a delay and configured to add delay to the command path delay, wherein the delay of the adjustable delay is based at least in part on a phase relationship between a feedback signal responsive to the command propagating through the command path and a clock signal, the feedback signal comprising an output signal of the adjustable delay, the command path further including a model delay configured to receive the output signal of the adjustable delay and model a propagation delay of a command tree.
2. The apparatus of claim 1, further comprising:
a clock path configured to provide a clock signal from an input to the command path.
3. The apparatus of claim 1, further comprising:
a clock path configured to provide first and second clock signals, the first clock signal provided to the command path for phase comparison with the feedback signal and the second clock signal provided to the command path to clock the command through the command path.
4. The apparatus of claim 1 wherein the command path further includes a phase detector configured to receive the feedback signal and the clock signal and further configured to provide a delay adjustment signal to the adjustable delay, the delay adjustment signal based at least in part on the phase relationship between the feedback signal and the clock signal.

5. The apparatus of claim 1, further comprising:
a clock path configured to receive a write clock signal and provide a data strobe signal; and
a data path including data capture latches coupled to the clock path and configured to convert serial data to parallel data responsive to the data strobe signal.

6. The apparatus of claim 1 wherein the command path further includes a command latch and decoder configured to latch and decode the command.

7. The apparatus of claim 1 wherein the command path is configured to output, generate, apply, or combinations thereof, the command to provide the command signal from the input to the output.

8. An apparatus, comprising:
a command path configured to provide an internal command signal responsive to an input command, the command path including a command path delay circuit, the command path delay circuit including an adjustable delay configured to add delay to a path delay of the command path and further including a phase detector, the phase detector configured to provide a delay adjustment signal to the adjustable delay of the command path delay circuit, the command path delay circuit further including a command path delay measurement circuit configured to determine a minimum command path delay and provide a signal indicative of the minimum command path delay.

9. The apparatus of claim 8, further comprising a clock path configured to provide a internal clock signal responsive to an input clock signal.

10. The apparatus of claim 9 wherein the command path further includes a command shift circuit configured to shift the input command responsive to the internal clock signal.

11. The apparatus of claim 8 comprises a memory including the command path.

12. The apparatus of claim 8 wherein the signal provided by the command path delay measurement circuit is indicative of the minimum command path delay in a number of clock cycles.

13. The apparatus of claim 8 wherein the command path delay measurement circuit is configured to be disabled after the minimum command path delay and the signal is provided.

14. The apparatus of claim 8 wherein the adjustable delay is configured to add delay to the path delay of the command path in increments less than a full clock cycle of a memory clock signal.

15. The apparatus of claim 8 wherein the command path is configured to output, generate, apply, or combinations thereof, the internal command to provide the internal command signal responsive to the input command.

16. A method, comprising:
determining a minimum command path delay and providing a count signal representing the minimum command path delay in number of clock cycles tCK;
shifting a write command through a command path a number of clock cycles of the clock signal equal to a total latency less the number of clock cycle tCK of the minimum command path delay; and
adding delay to a command path delay of a command path, wherein the delay is based on a phase difference between a feedback signal based the propagating write command and an internal memory clock signal.

17. The method of claim 16 wherein shifting the write command comprises:
shifting the write command responsive to a clock signal from a clock path.

18. The method of claim 16 wherein providing a count signal comprises outputting, generating, applying, or combinations thereof, the count signal.

19. The method of claim 16 wherein propagating the write command through the command path comprises:
latching and decoding the write command;
shifting the write command based at least in part on a latency; and
providing the decoded command through a command tree.

20. The method of claim 16 wherein adding delay to the command path delay comprises:
adjusting an adjustable delay included in the command path to synchronize the feedback signal and the internal memory clock signal.

21. An apparatus, comprising:
a command path having a command path delay and configured to provide a command from an input to an output, the command path including an adjustable delay having a delay and configured to add delay to the command path delay, wherein the delay of the adjustable delay is based at least in part on a phase relationship between a feedback signal responsive to the command propagating through the command path and a clock signal;
a clock path configured to receive a write clock signal and provide a data strobe signal; and
a data path including data capture latches coupled to the clock path and configured to convert serial data to parallel data responsive to the data strobe signal.

22. An apparatus, comprising:
a command path configured to provide an internal command signal responsive to an input command, the command path including a command path delay circuit, the command path delay circuit including an adjustable delay configured to add delay to a path delay of the command path and further including a phase detector, the adjustable delay configured to add delay to the path delay of the command path in increments less than a full clock cycle of a memory clock signal, the phase detector configured to provide a delay adjustment signal to the adjustable delay of the command path delay circuit.

23. A method, comprising;
latching and decoding a write command;
shifting the write command through a command path based at least in part on a latency;
adding delay to a command path delay of the command path, wherein the delay is based on a phase difference between a feedback signal based on the shifting write command and an internal memory clock signal; and
providing the decoded command through a command tree.

* * * * *

UNITED STATES PATENT AND TRADEMARK OFFICE
CERTIFICATE OF CORRECTION

| | | |
|---|---|---|
| PATENT NO. | : 9,001,594 B2 | Page 1 of 1 |
| APPLICATION NO. | : 13/543698 | |
| DATED | : April 7, 2015 | |
| INVENTOR(S) | : Venkat Bringivijayaraghavan | |

It is certified that error appears in the above-identified patent and that said Letters Patent is hereby corrected as shown below:

IN THE CLAIMS

| | Reads | Should Read |
|---|---|---|
| Column 10, Line 3 | "a feedback signal based the" | --a feedback signal based on the-- |

Signed and Sealed this
Twentieth Day of October, 2015

Michelle K. Lee
*Director of the United States Patent and Trademark Office*